United States Patent
Curtis et al.

(10) Patent No.: US 10,779,443 B2
(45) Date of Patent: Sep. 15, 2020

(54) SYSTEM AND METHOD OF UTILIZING INFORMATION HANDLING SYSTEMS IN A CHAMBER

(71) Applicant: Dell Products L.P., Round Rock, TX (US)

(72) Inventors: Robert Boyd Curtis, Georgetown, TX (US); Mukund Purshottam Khatri, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 113 days.

(21) Appl. No.: 16/054,403

(22) Filed: Aug. 3, 2018

(65) Prior Publication Data

US 2020/0045858 A1 Feb. 6, 2020

(51) Int. Cl.
  *H05K 7/20* (2006.01)
  *G06F 11/30* (2006.01)
  *G06F 9/50* (2006.01)
  *G06F 1/20* (2006.01)

(52) U.S. Cl.
  CPC ......... *H05K 7/20836* (2013.01); *G06F 1/206* (2013.01); *G06F 9/5083* (2013.01); *G06F 9/5094* (2013.01); *G06F 11/3058* (2013.01); *G06F 2201/81* (2013.01)

(58) Field of Classification Search
  CPC . H05K 7/20836; G06F 9/5094; G06F 9/5083; G06F 1/206; G06F 11/3058; G06F 2201/81
  See application file for complete search history.

(56) References Cited

U.S. PATENT DOCUMENTS

| 4,753,388 A | * | 6/1988 | Rummage | F23N 5/203 236/46 R |
| 2005/0210896 A1 | * | 9/2005 | Durant | G06F 1/206 62/178 |
| 2010/0217454 A1 | * | 8/2010 | Spiers | G05D 23/1932 700/300 |
| 2017/0138628 A1 | * | 5/2017 | Sondur | F24F 11/30 |

* cited by examiner

*Primary Examiner* — Chun Cao
(74) *Attorney, Agent, or Firm* — Baler Botts L.L.P.

(57) ABSTRACT

In one or more embodiments, one or more systems, methods, and/or processes may receive ambient temperature limits of information handling systems; may receive ambient temperatures associated with the information handling systems; may determine ambient temperature margins based at least on the ambient temperature limits and the ambient temperatures; may determine that each ambient temperature margin of the ambient temperature margins is above an ambient temperature margin threshold of ambient temperature margin thresholds associated with the information handling systems; in response to determining that each ambient temperature margin of the ambient temperature margins is above the ambient temperature margin threshold of the ambient temperature margin thresholds associated with the information handling systems, may determine that a supply air temperature of the computer room is to be increased; and may reduce a duty cycle of a cooling system of a computer room air handler associated with the computer room.

15 Claims, 7 Drawing Sheets

SYSTEM AND METHOD OF UTILIZING INFORMATION HANDLING SYSTEMS IN A CHAMBER

BACKGROUND

Field of the Disclosure

This disclosure relates generally to information handling systems and more particularly to utilizing information handling systems in a chamber.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, methods, and/or processes may access a database that stores ambient temperature limits associated with respective information handling systems located in a computer room; may receive the ambient temperature limits from the database; may receive ambient temperatures associated with the information handling systems; may determine ambient temperature margins based at least on the ambient temperature limits and the ambient temperatures; may determine that each ambient temperature margin of the ambient temperature margins is at or above an ambient temperature margin threshold of ambient temperature margin thresholds associated with the information handling systems; may, in response to determining that each ambient temperature margin of the ambient temperature margins is at or above the ambient temperature margin threshold of the ambient temperature margin thresholds associated with the information handling systems, determine that a supply air temperature of the computer room is to be increased; and may, in response to determining that the supply air temperature of the computer room is to be increased, may reduce a duty cycle of a cooling system of a computer room air handler associated with the computer room.

In one or more embodiments, the one or more systems, methods, and/or processes may further receive supply air temperatures from the information handling systems. For example, the supply air temperatures may be based at least on inlet temperatures of the information handling systems. In one or more embodiments, the one or more systems, methods, and/or processes may further determine a maximum supply air temperature from the supply air temperatures and may further determine that the maximum supply air temperature is above a threshold temperature. For example, determining that the supply air temperature of the computer room is to be increased may be based at least on determining that the maximum supply air temperature is below the threshold temperature. In one or more embodiments, the one or more systems, methods, and/or processes may further determine a minimum ambient temperature margin from the ambient temperature margins. For example, determining that the supply air temperature of the computer room is to be increased may include determining that the supply air temperature of the computer room is to be increased by the minimum ambient temperature margin.

In one or more embodiments, the one or more systems, methods, and/or processes may further determine that a first ambient temperature margin of the ambient temperature margins meets or is below a first ambient temperature margin threshold of the ambient temperature margin thresholds associated with a first information handling system of the information handling systems; may further determine that a second ambient temperature margin of the ambient temperature margins is above a second ambient temperature margin threshold of the ambient temperature margin thresholds associated with a second information handling system of the information handling systems; and may further, in response to determining that the first ambient temperature margin meets or is below the first ambient temperature margin threshold and determining that the second ambient temperature margin is above the second ambient temperature margin threshold, transfer a workload being processed by the first information handling system to the second information handling system.

In one or more embodiments, in response to determining that the first ambient temperature margin meets or is below the first ambient temperature margin threshold and determining that the second ambient temperature margin is above the second ambient temperature margin threshold, the one or more systems, methods, and/or processes may further determine if the second information handling system includes applicable hardware utilized by a workload being processed by the first information handling system. If the second information handling system includes the applicable hardware utilized by the workload, the one or more systems, methods, and/or processes may further transfer the workload to the second information handling system. If the second information handling system does not include the applicable hardware utilized by the workload the one or more systems, methods, and/or processes may further determine that a third ambient temperature margin of the ambient temperature margins is above a third ambient temperature margin threshold of the ambient temperature margin thresholds associated with a third information handling system of the information handling systems; may further determine that the third information handling system includes the applicable hardware utilized by the workload; and may further transfer the workload to the third information handling system.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a computer room (e.g., a chamber) may be cooled by setting a computer room air handler (CRAH) to a supply air temperature. In one example, the supply air temperature may be set based at least on what a computer room manager (e.g., a person) believes is required to cool information handling systems of the computer room. For instance, the supply air temperature may be set below a supply air temperature that is sufficient to ensure a sufficient cooling margin and/or account for hot areas in the computer room, which may result in a lower supply air temperature than required for information handling systems and/or excess power consumption by a cooling infrastructure associated with the computer room. In another example, the supply air temperature may be set based at least on information received from information handling systems of a computer room. For instance, a computer room may be configured to provide a closed loop control of an ambient temperature to information handling systems of the computer room. In one or more embodiments, a CRAH may be or include a computer room air conditioner (CRAC).

In one or more embodiments, an excess thermal margin may be generated. For example, generating an excess thermal margin may consume excess power. For instance, more power may be consumed than what may be necessary to cool information handling systems of a computer room. In one or more embodiments, an ambient temperature capability of an information handling system may be monitored. For example, an ambient temperature capability of an information handling system may be monitored at a computer room level. In one or more embodiments, ambient temperature capability values of information handling systems may be aggregated. For example, units of a CRAH may be controlled based at least on an ambient temperature aligned with ambient temperatures that may be requisite of the information handling systems of the computer room. For instance, an ambient temperature that may be requisite of an information handling system may be an ambient temperature limit of the information handling system.

In one or more embodiments, supply air temperature in a computer room may be aligned with ambient temperature capabilities of information handling systems. For example, multiple information handling systems may provide respective ambient temperatures at one or more times. In one or more embodiments, if an information handling system does not provide an ambient temperature, an ambient temperature may be estimated. For example, an estimate for the ambient temperature may be an ambient temperature determined by a manufacturer of the information handling system. For instance, a maximum ambient temperature for the information handling system may be manually provided.

In one or more embodiments, a computer room may implement a closed loop control process to align supply air temperature to a requisite ambient temperature of the information handling systems. In one example, if supply air temperature may be increased, energy may be conserved. In another example, if a workload may be moved from a first information handling system to a second information handling system with an ambient temperature margin higher than the first information handling system, supply air temperature may not be decreased. For instance, not decreasing the supply air temperature may save energy expended to cool information handling systems of a computer room. In one or more embodiments, additional workloads may be placed on one or more information handling systems with an ambient temperature margin above a threshold. In one or more embodiments, one or more additional information handling systems may be placed in one or more zones of a computer room based at least on supply air temperature of the one or more zones of the computer room and/or based at least on one or more ambient temperature margins respectively associated with the one or more additional information handling systems.

In one or more embodiments, power consumed by information handling systems of a rack may be aggregated. For example, power consumption of the information handling systems of the rack may be stored with temperature information of ambient air temperatures of the information handling systems. For instance, a minimum power consumption may be determined from aggregated rack power consumption information and computer room air temperature information. In one or more embodiments, increasing a computer room air temperature may increase power utilization by the information handling systems located in the computer room. For example, increasing a computer room air temperature may increase fan utilization of fans of the information handling systems located in the computer room. For instance, an increase in power consumption of fan utilization of the information handling systems may offset power conserved by not utilizing a cooling system, which may increase a computer room air temperature. In one or more embodiments, a computer room air temperature that minimizes power consumption by one or more racks and by a CRAH may be determined from aggregated rack power consumption information and computer room air temperature information. For example, utilizing the computer room air temperature that minimizes power consumption may conserve power utilized by a computer room and/or by information handling systems located in the computer room. For instance, conserving power utilized by a computer room and/or by information handling systems located in the computer room may reduce one or more environmental pollutants, which may provide one or more advantages.

Figure 1:
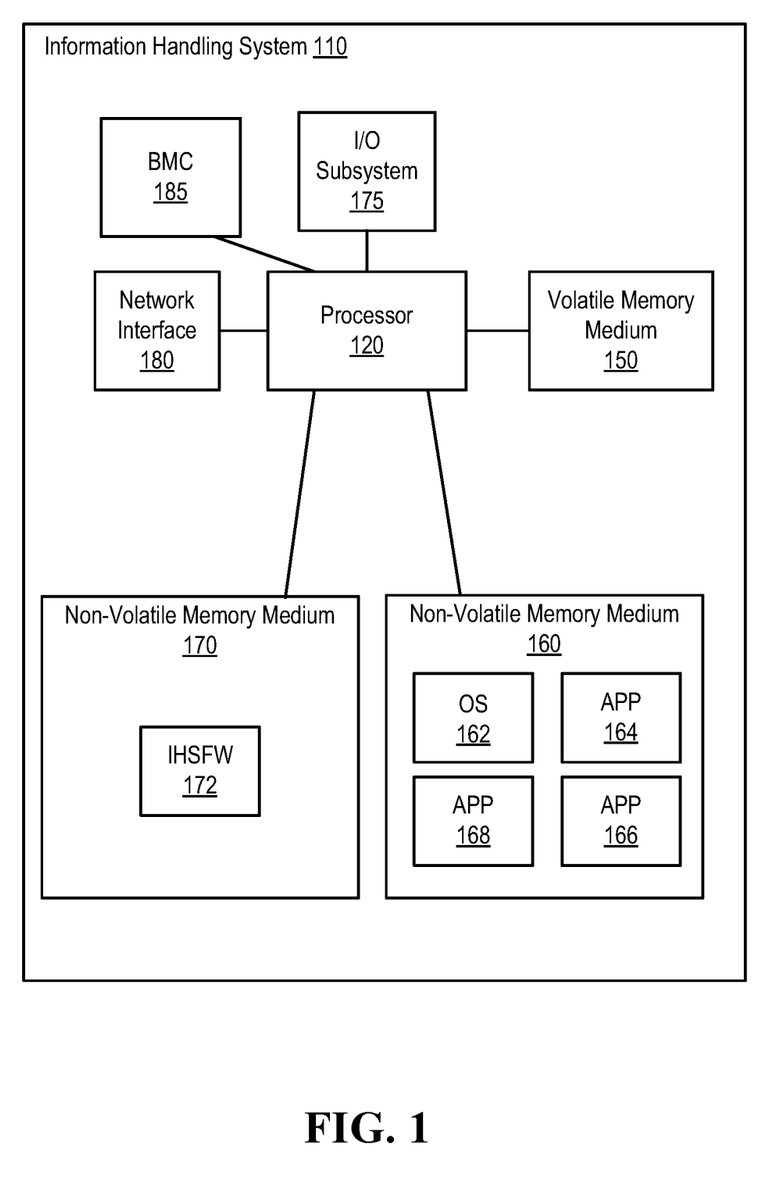
FIG. 1 illustrates an example of an information handling system, according to one or more embodiments.

Turning now to FIG. 1, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, a network interface 180, and a baseboard management controller (BMC) 185. As illustrated, volatile memory medium 150, non-volatile memory media 160 and 170, I/O subsystem 175, network interface 180, and BMC 185 may be communicatively coupled to processor 120.

In one or more embodiments, one or more of volatile memory medium 150, non-volatile memory media 160 and 170, I/O subsystem 175, network interface 180, and BMC 185 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing one or more systems, one or more flowcharts, one or more methods, and/or one or more processes described herein. In one example, processor 120 may execute processor instructions from one or more of memory media 150-170 in implementing one or more systems, one or more flowcharts, one or more methods, and/or one or more processes described herein. In another example, processor 120 may execute processor instructions via network interface 180 in implementing one or more systems, one or more flowcharts, one or more methods, and/or one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, BMC 185 may be or include a remote access controller. For example, the remote access controller may be or include a Dell Remote Access Controller (DRAC). In one or more embodiments, a remote access controller may be integrated into IHS 110. For example, the remote access controller may be or include an integrated Dell Remote Access Controller (iDRAC). In one or more embodiments, a remote access controller may include one or more of a processor, and a memory, a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. For example, the remote access controller may be based at least on an Intelligent Platform Management Interface (IPMI) standard. For instance, the remote access controller may allow and/or permit utilization of IPMI out-of-band interfaces such as IPMI Over LAN (local area network). In one or more embodiments, a remote access controller may include and/or provide one or more internal private networks. For example, the remote access controller may include and/or provide one or more of an Ethernet interface, a front panel USB interface, and a Wi-Fi interface, among others.

In one or more embodiments, BMC 185 may be or include a microcontroller. For example, the microcontroller may be or include an 8051 microcontroller, an ARM Cortex-M (e.g., Cortex-M0, Cortex-M0+, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, BMC 185 may be or include one or more of a field programmable gate array (FPGA) and an ASIC, among others, configured, coded, and/or encoded with instructions in accordance with one or more of systems, one or more flowcharts, one or more methods, and/or one or more processes described herein.

In one or more embodiments, processor 120 and one or more components of IHS 110 may be included in a system-on-chip (SoC). For example, the SoC may include processor 120 and a platform controller hub (not specifically illustrated).

Figure 2:
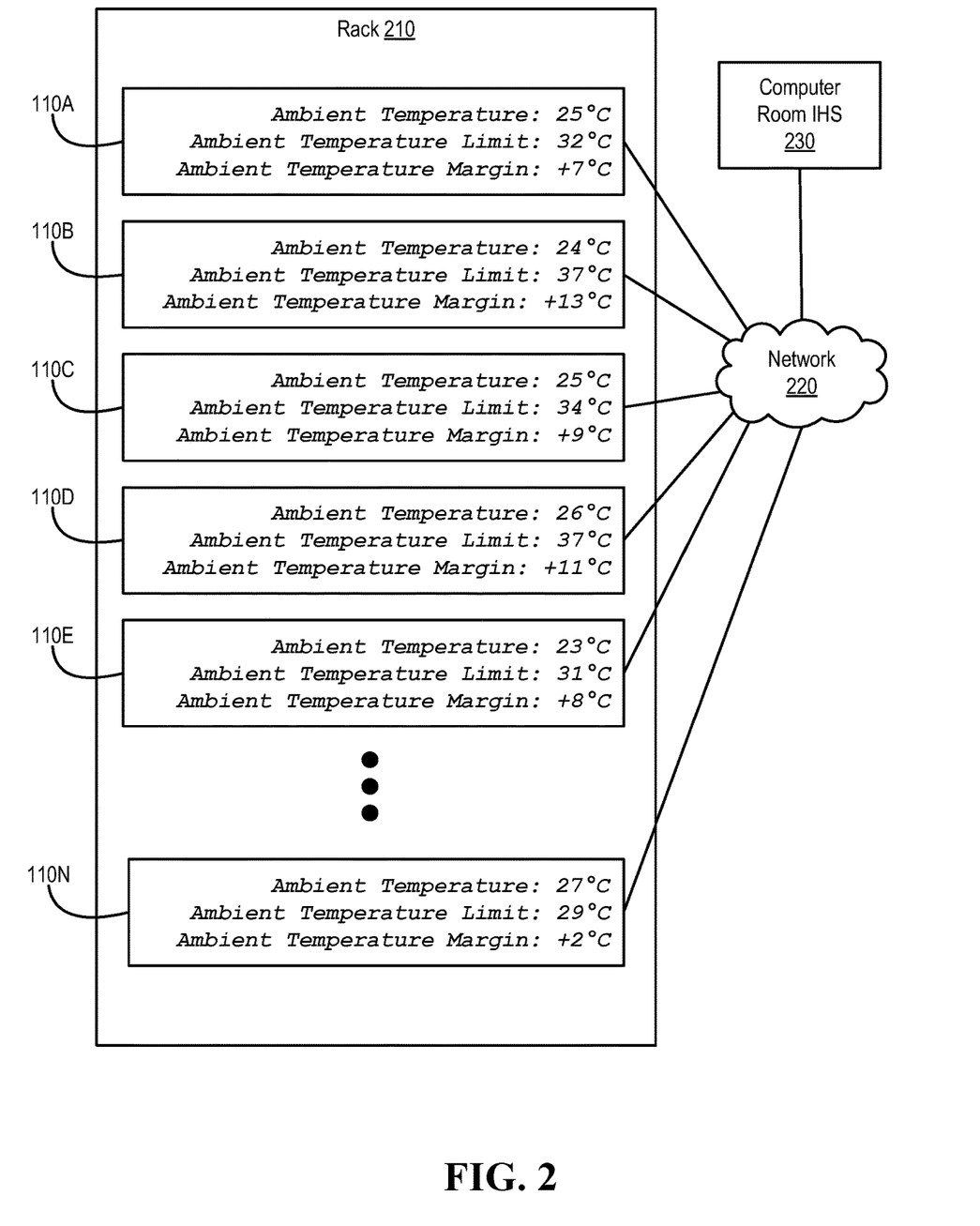
FIG. 2 illustrates an example of a rack that includes information handling systems, according to one or more embodiments.

Turning now to FIG. 2, an example of a rack that include information handling systems is illustrated, according to one or more embodiments. As shown, a rack 210 may include information handling systems (IHSs) 110A-110N. In one or more embodiments, rack 210 may be located in a computer room (e.g., a chamber). In one example, a data center may include the computer room. For instance, a data center may include one or more computer rooms. In another example, the computer room may be a data center. As illustrated, IHSs 110A-110N may be communicatively coupled to a network 220. In one or more embodiments, network 220 may include a wired network, a wireless network, an optical network, or a combination of the foregoing, among others. For example, network 220 may include and/or be coupled to various types of communications networks. For instance, network 220 may include and/or be coupled to a LAN, a WLAN, a MAN, a WAN (e.g., a private WAN, a corporate WAN, a public WAN, etc.), an Internet, a public switched telephone network (PSTN), a cellular telephone network, a satellite telephone network, or a combination of the foregoing, among others. As shown, a computer room IHS 230 may be coupled to network 220. In one or more embodiments, computer room IHS 230 may include one or more structures and/or one or more functionalities as those described with reference to IHS 110.

In one or more embodiments, an information handling system may be associated with an ambient temperature, an ambient temperature limit, and an ambient temperature margin, among others. In one example, an ambient temperature may be an air temperature inside the information handling system. In a second example, an ambient temperature limit may be a maximum recommended air temperature inside the information handling system. For instance, a manufacture of the information handling system may not recommend operating the information handling system with an ambient temperature above the ambient temperature limit. In another example, an ambient temperature margin may be a difference between an ambient temperature limit and an ambient temperature. For instance, an ambient temperature margin may be how much of an ambient temperature increase may be handled by the information handling system.

As shown, IHS 110A may be associated with an ambient temperature of 25° C., an ambient temperature limit 32° C., and an ambient temperature margin +7° C. As illustrated, IHS 110B may be associated with an ambient temperature of 24° C., an ambient temperature limit 37° C., and an ambient temperature margin +13° C. As shown, IHS 110C may be associated with an ambient temperature of 25° C., an ambient temperature limit 34° C., and an ambient temperature margin +9° C. As illustrated, IHS 110D may be associated with an ambient temperature of 26° C., an ambient temperature limit 37° C., and an ambient temperature margin +11° C. As shown, IHS 110E may be associated with an ambient temperature of 23° C., an ambient temperature limit 31° C., and an ambient temperature margin +8° C. As illustrated, IHS 110N may be associated with an ambient temperature of 27° C., an ambient temperature limit 29° C., and an ambient temperature margin +2° C. In one or more embodiments, an IHS 110 may provide one or more of an ambient temperature, an ambient temperature limit, and an ambient temperature margin, among others, to computer room IHS 230 via network 220. For example, an IHS 110 may provide an ambient temperature to computer room IHS 230 via network 220 at one or more times. For instance, an IHS 110 may provide an ambient temperature to computer room IHS 230 via network 220 at one or more periods of time. In one or more embodiments, a BMC 185 of an IHS 110 may provide an ambient temperature to computer room IHS 230 via network 220.

Figure 3A:
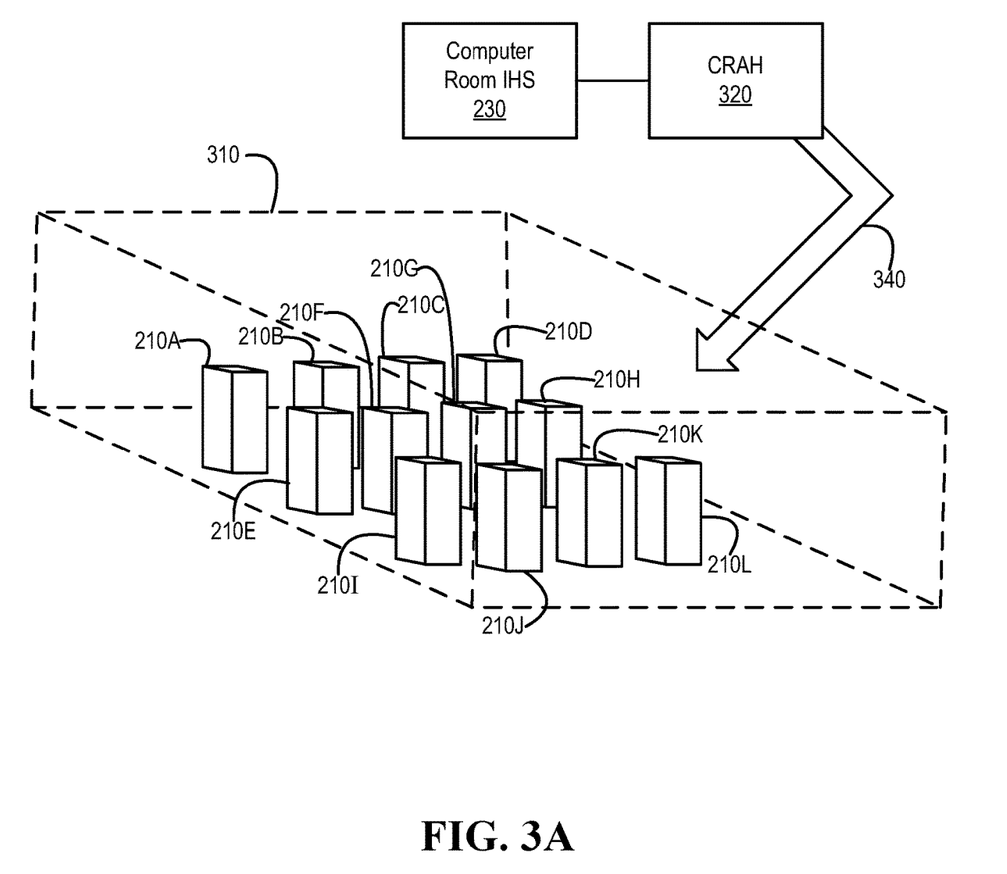
FIGS. 3A-3C illustrate examples of a computer room, according to one or more embodiments.
Figure 3B:
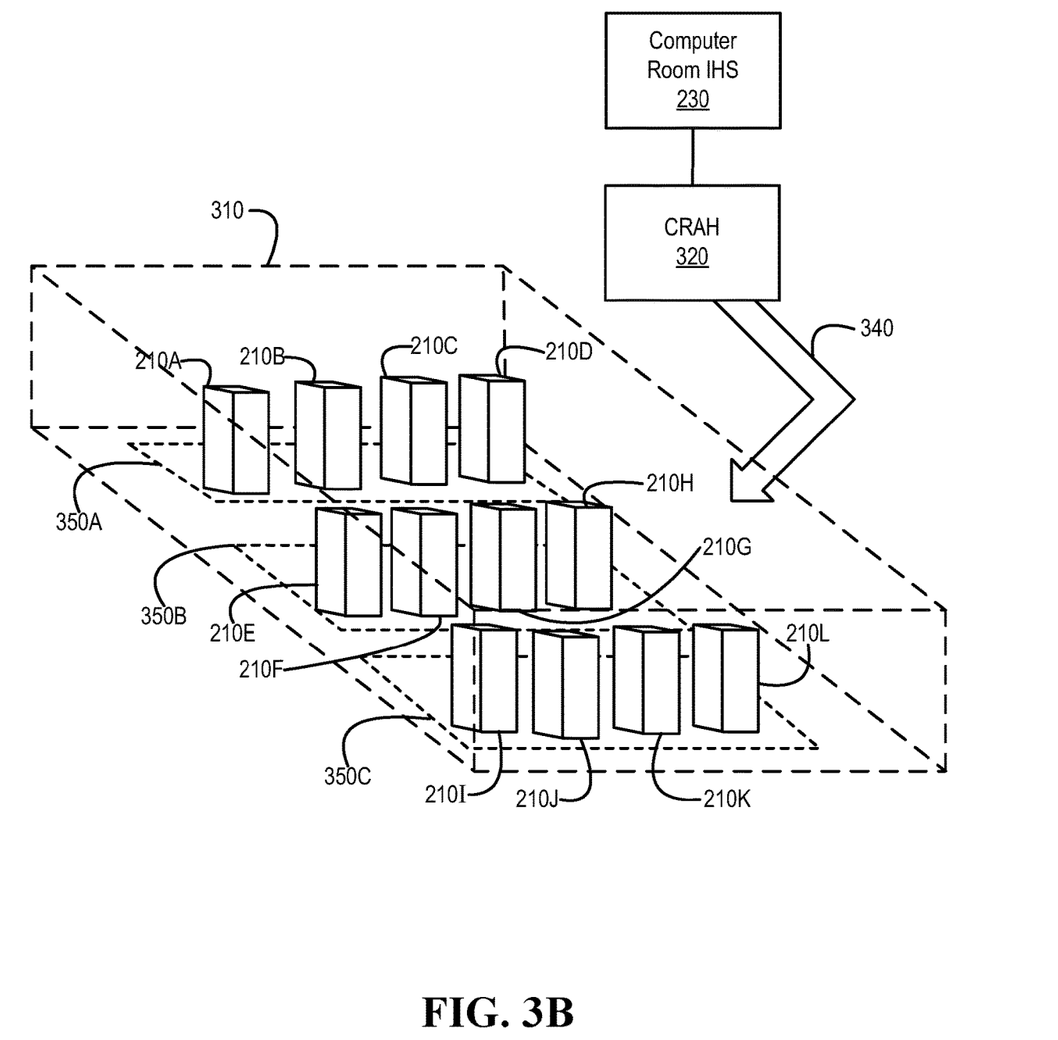
Figure 3C:
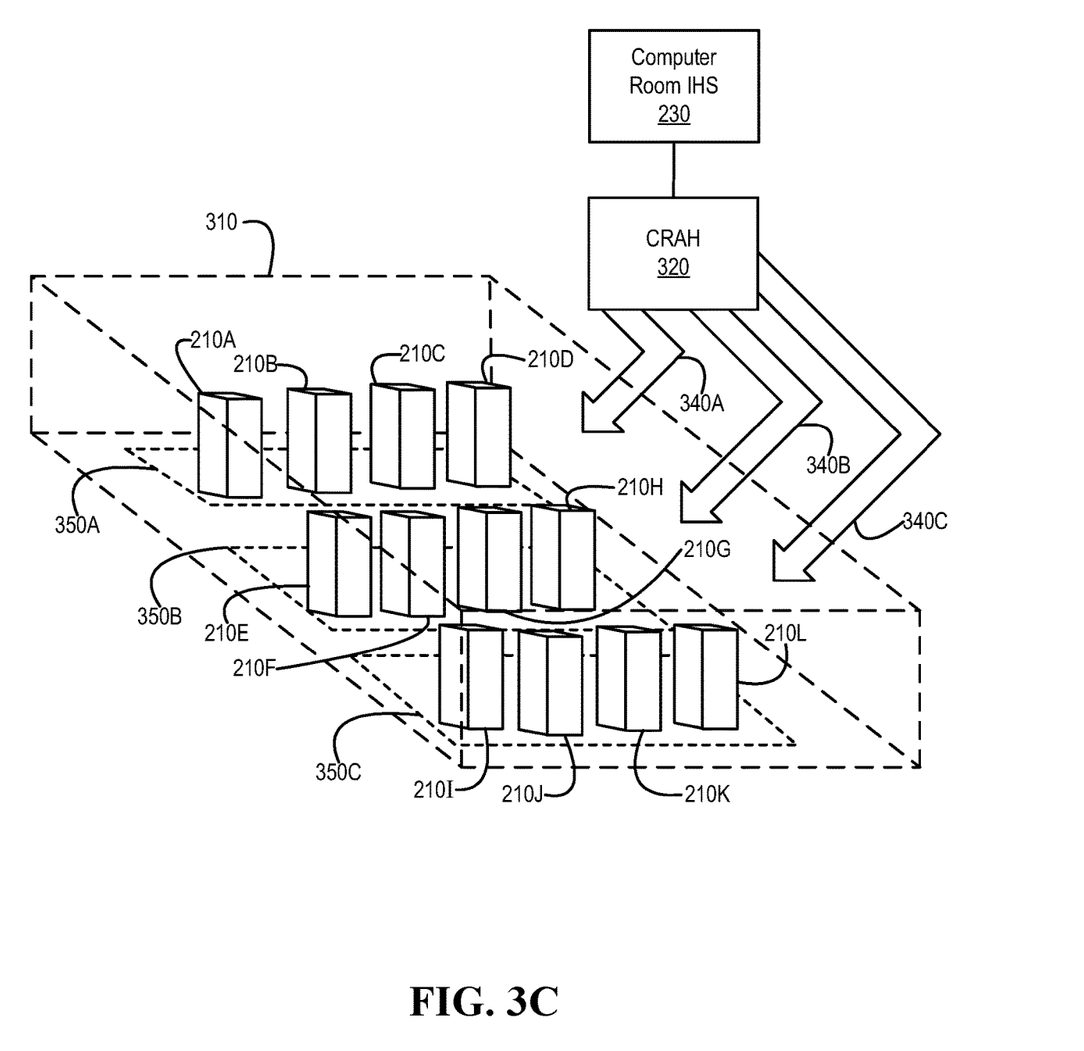

Turning now to FIGS. 3A-3C, examples of a computer room are illustrated, according to one or more embodiments. As shown in FIG. 3A, a computer room 310 may include racks 210A-210L. In one or more embodiments, computer room 310 may be or include a chamber. As illustrated in FIG. 3A, a CRAH 320 may be coupled to computer room IHS 230. For example, CRAH 320 may be coupled to computer room IHS 230 via network 220. In one or more embodiments, CRAH 320 may provide air 340 to racks 210A-210L. In one or more embodiments, air 340 may be associated with a supply air temperature. For example, computer room IHS 230 may control CRAH 320. For instance, CRAH 320 may control a supply air temperature associated with air 340. As shown in FIG. 3B, computer room 310 may include zones 350A-350C. In one or more embodiments, two or more of zones 350A-350C may be partitioned. In one example, a partition may be or include a wall. In another example, a partition may be or include a curtain. As illustrated, zone 350A may include racks 210A-210D. As shown, zone 350B may include racks 210E-210H. As shown, zone 350C may include racks 2101-210L. As illustrated in FIG. 3C, air 340A-340C may be provided to zones 350A-350C, respectively. For example, CRAH 320 may provide air 340A-340C to zones 350A-350C, respectively. For instance, CRAH 320 may provide air 340A-340C at respectively different supply air temperatures.

In one or more embodiments, computer room IHS 230 may access a database that stores ambient temperature limits associated with respective information handling systems located in computer room 310. For example, computer room IHS 230 may receive the ambient temperature limits from the database. In one or more embodiments, a manufacturer may determine an ambient temperature limit for an information handling system. In one example, BMC 185 of the information handling system may provide the ambient temperature limit for the information handling system to the database. In another example, the ambient temperature limit for the information handling system may be manually entered into the database.

In one or more embodiments, computer room IHS 230 may receive ambient temperatures associated with the information handling systems located in computer room 310. For example, an ambient temperature of an information handling system may be a temperature of air inside the information handling system. In one or more embodiments, computer room IHS 230 may determine ambient temperature margins based at least on the ambient temperature limits and the ambient temperatures. For example, computer room IHS 230 may determine an ambient temperature margin by subtracting an ambient temperature from an ambient temperature limit. In one or more embodiments, computer room IHS 230 may determine that each ambient temperature margin of the ambient temperature margins is above an ambient temperature margin threshold of ambient temperature margin thresholds associated with the information handling systems. In one or more embodiments, an ambient temperature margin threshold may be a number of degrees.

In one or more embodiments, computer room IHS 230 may determine that a supply air temperature of the computer room is to be increased. In one example, computer room IHS 230 may determine that a supply air temperature of air 340 may be increased. In another example, computer room IHS 230 may determine that one or more supply air temperatures of respective one or more of air 340A-340C may be increased. For instance, computer room IHS 230 may control supply air temperatures associated with one or more of zones 350A-350C. In one or more embodiments, computer room IHS 230 may reduce a duty cycle of CRAH 320 associated with the computer room. For example, computer room IHS 230 may provide one or more instructions to CRAH 320 to reduce a duty cycle of a cooling system of CRAH 320. For instance, CRAH 320 may cycle on and off a cooling system. In one or more embodiments, when CRAH 320 cycles on the cooling system, CRAH 320 may cool air 340. For example, reducing a duty cycle of the cooling system may include reducing one or more amounts of time that the cooling system cools air 340.

In one or more embodiments, computer room IHS 230 may receive supply air temperatures from information handling systems located in computer room 310. For example, the supply air temperatures may be based at least on inlet temperatures of the information handling systems. For instance, an information handling system may include one or more inlets for supply air to enter the information handling system. In one or more embodiments, computer room IHS 230 may determine a maximum supply air temperature from the supply air temperatures. For example, computer room IHS 230 may determine that the maximum supply air temperature is below a threshold temperature. For instance, if the maximum supply air temperature is below the threshold temperature, it may be determined that a temperature of air 340 is below the threshold temperature. In one or more embodiments, determining that the supply air temperature of the computer room is to be increased may be based at least on determining that the maximum supply air temperature is below the threshold temperature. In one or more embodiments, computer room IHS 230 may determine a minimum ambient temperature margin from the ambient temperature margins. For example, determining that the supply air temperature of the computer room is to be increased may include determining that the supply air temperature of the computer room is to be increased by the minimum ambient temperature margin.

In one or more embodiments, computer room IHS 230 may determine that a first ambient temperature margin of the ambient temperature margins meets or is below a first ambient temperature margin threshold of the ambient temperature margin thresholds associated with a first information handling system of the information handling systems located in computer room 310. In one or more embodiments, computer room IHS 230 may determine that a second ambient temperature margin of the ambient temperature margins is above a second ambient temperature margin threshold of the ambient temperature margin thresholds associated with a second information handling system of the information handling systems located in computer room 310. In one example, the first information handling system may be IHS 110N. In another example, the second information handling system may be IHS 110C. In one instance, the first ambient temperature margin threshold may be 2° C., where the first ambient temperature margin (e.g., 2° C.) meets or is below 2° C. In another instance, the second ambient temperature margin threshold may be 7° C., where the second ambient temperature margin (e.g., 9° C.) is above 7° C.

In one or more embodiments, a workload being processed by the first information handling system may be transferred to the second information handling system. For example, computer room IHS 230 may provide instructions to one or more of the first information handling system and the second information handling system to transfer the workload from the first information handling system to the second information handling system. In one instance, the first information handling system and the second information handling system may be located in the same rack 210. In a second instance, the first information handling system and the second information handling system may be located in different racks 210. In a third instance, the first information handling system and the second information handling system may be located in the same zone 350. In another instance, the first information handling system and the second information handling system may be located in different zones 350. In one or more embodiments, transferring the workload being from the first information handling system to the second information handling system may be performed in response to determining that the first ambient temperature margin meets or is below the first ambient temperature margin threshold and determining that the second ambient temperature margin is above the second ambient temperature margin threshold. In one or more embodiments, the workload may include a virtual machine.

In one or more embodiments, computer room IHS 230 may determine if the second information handling system includes applicable hardware utilized by the workload. For example, the workload may utilize a graphics processing unit (GPU). For instance, the applicable hardware utilized by the workload may include a GPU. In one or more embodiments, determining if the second information handling system includes the applicable hardware utilized by the workload may be performed in response to determining that the first ambient temperature margin meets or is below the first ambient temperature margin threshold and determining that the second ambient temperature margin is above the second ambient temperature margin threshold.

If the second information handling system includes the applicable hardware utilized by the workload, the workload may be transferred to the second information handling system. If the second information handling system does not include the applicable hardware utilized by the workload, computer room IHS 230 may determine that a third ambient temperature margin of the ambient temperature margins is above a third ambient temperature margin threshold of the ambient temperature margin thresholds associated with a third information handling system of the information handling systems located in computer room 310.

In one or more embodiments, computer room IHS 230 may determine that the third information handling system includes the applicable hardware utilized by the workload. For example, the workload may be transferred to the third information handling system. In one instance, the first information handling system and the third information handling system may be located in the same rack 210. In a second instance, the first information handling system and the third information handling system may be located in different racks 210. In a third instance, the first information handling system and the third information handling system may be located in the same zone 350. In another instance, the first information handling system and the third information handling system may be located in different zones 350. In one or more embodiments, computer room IHS 230 may provide instructions to one or more of the first information handling system and the third information handling system to transfer the workload from the first information handling system to the third information handling system. In one or more embodiments, the workload may include a virtual machine.

Figure 4A:
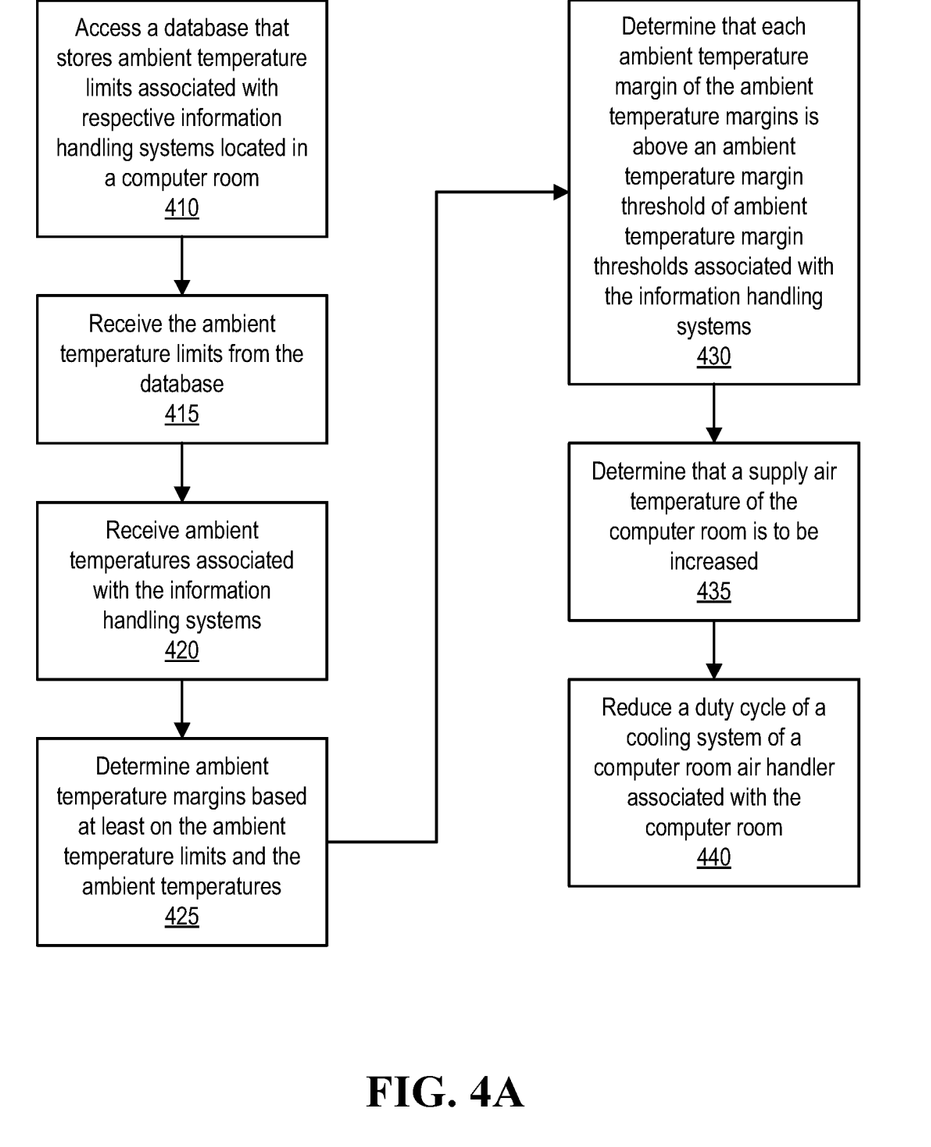
FIG. 4A illustrates an example of a method of utilizing information handling systems, according to one or more embodiments.

Turning now to FIG. 4A, an example of a method of utilizing information handling systems is illustrated, according to one or more embodiments. At 410, a database that stores ambient temperature limits associated with respective information handling systems, located in a computer room, may be accessed. For example, computer room IHS 230 may access a database that stores ambient temperature limits associated with respective information handling systems located in computer room 310. In one instance, the database may be external to computer room IHS 230. In another instance, computer room IHS 230 may include the database.

At 415, the ambient temperature limits may be received from the database. For example, computer room IHS 230 may receive the ambient temperature limits from the database. At 420, ambient temperatures associated with the information handling systems may be received. For example, computer room IHS 230 may receive ambient temperatures associated with the information handling systems. In one or more embodiments, an ambient temperature of an information handling system may be a temperature of air inside the information handling system.

At 425, ambient temperature margins may be determined based at least on the ambient temperature limits and the ambient temperatures. For example, computer room IHS 230 may determine ambient temperature margins based at least on the ambient temperature limits and the ambient temperatures. For instance, computer room IHS 230 may determine an ambient temperature margin by subtracting an ambient temperature from an ambient temperature limit.

At 430, it may be determined that each ambient temperature margin of the ambient temperature margins is above an ambient temperature margin threshold of ambient temperature margin thresholds associated with the information handling systems. For example, computer room IHS 230 may determine that each ambient temperature margin of the ambient temperature margins is above an ambient temperature margin threshold of ambient temperature margin thresholds associated with the information handling systems.

At 435, it may be determined that a supply air temperature of the computer room is to be increased. For example, computer room IHS 230 may determine that a supply air temperature of the computer room is to be increased. In one instance, computer room IHS 230 may determine that a supply air temperature of air 340 may be increased. In another instance, computer room IHS 230 may determine that one or more supply air temperatures of respective one or more of air 340A-340C may be increased. In one or more embodiments, determining that a supply air temperature of the computer room is to be increased may be performed in response to determining that each ambient temperature margin of the ambient temperature margins is above an ambient temperature margin threshold of the ambient temperature margin thresholds associated with the information handling systems.

At 440, a duty cycle of a cooling system of a computer room air handler associated with the computer room may be reduced. For example, computer room IHS 230 may reduce a duty cycle of a cooling system of a computer room air handler associated with the computer room. For instance, computer room IHS 230 may provide one or more instructions to CRAH 320 to reduce a duty cycle of a cooling system of CRAH 320 associated with computer room 310. In one or more embodiments, reducing a duty cycle of a cooling system of a computer room air handler associated with the computer room may be performed in response to determining that the supply air temperature of the computer room is to be increased. In one or more embodiments, CRAH 320 may include the cooling system. In one or more embodiments, reducing a duty cycle of a cooling system of a computer room air handler associated with the computer room may conserve energy. For example, conserving energy may reduce one or more environmental pollutants.

Figure 4B:
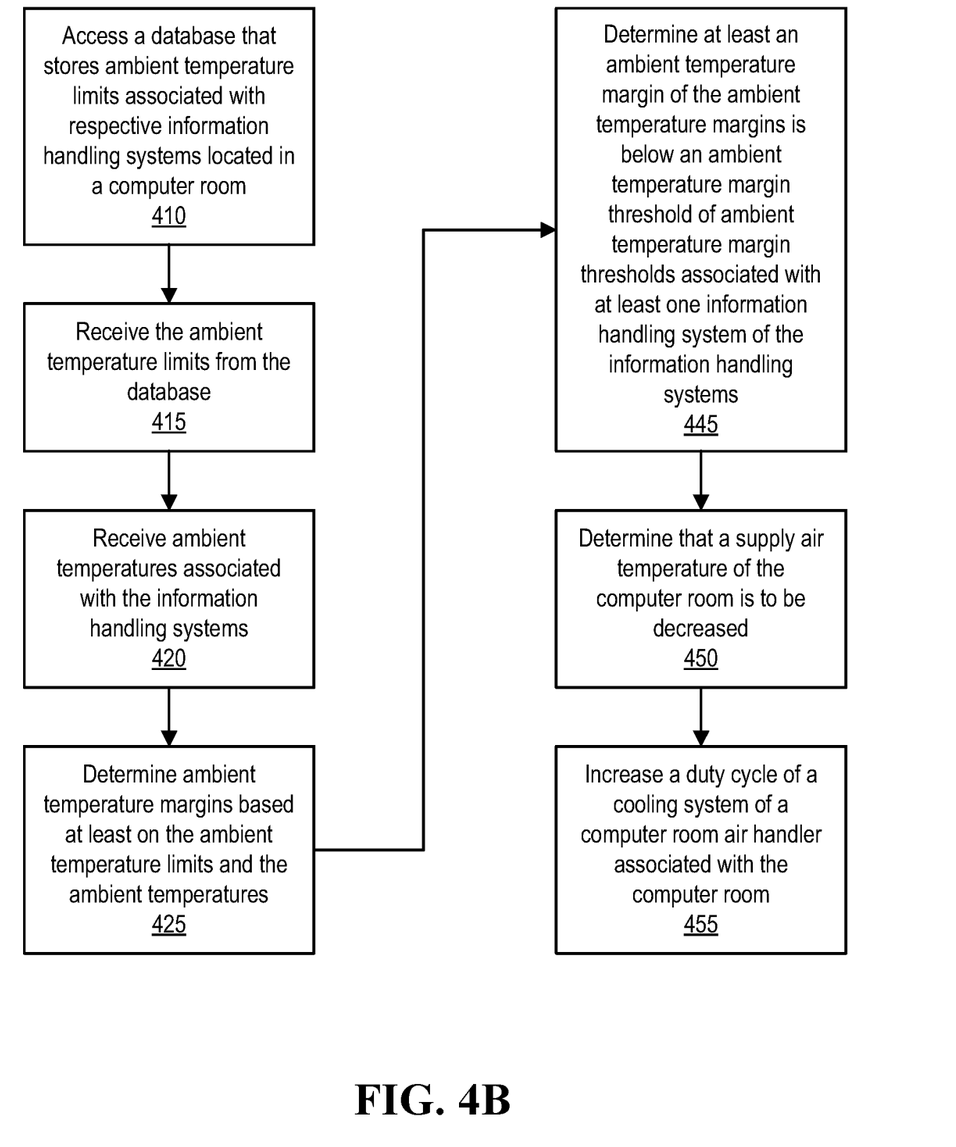
FIG. 4B illustrates another example of a method of utilizing information handling systems, according to one or more embodiments.

Turning now to FIG. 4B, an example of a method of utilizing information handling systems is illustrated, according to one or more embodiments. Method elements 410-425 of FIG. 4B may be performed in accordance with method elements 410-425 of FIG. 4A, according to one or more embodiments.

At 445, it may be determined that at least an ambient temperature margin of the ambient temperature margins is below an ambient temperature margin threshold of ambient temperature margin thresholds associated with at least one information handling system of the information handling systems. For example, computer room IHS 230 may determine that at least an ambient temperature margin of the ambient temperature margins is below an ambient temperature margin threshold of ambient temperature margin thresholds associated with at least one information handling system of the information handling systems.

At 450, it may be determined that a supply air temperature of the computer room is to be decreased. For example, computer room IHS 230 may determine that a supply air temperature of the computer room is to be decreased. In one instance, computer room IHS 230 may determine that a supply air temperature of air 340 may be decreased. In another instance, computer room IHS 230 may determine that one or more supply air temperatures of respective one or more of air 340A-340C may be decreased. In one or more embodiments, determining that a supply air temperature of the computer room is to be decreased may be performed in response to determining that at least an ambient temperature margin of the ambient temperature margins is below an ambient temperature margin threshold of ambient temperature margin thresholds associated with at least one information handling system of the information handling systems.

At 455, a duty cycle of a cooling system of a computer room air handler associated with the computer room may be increased. For example, computer room IHS 230 may increase a duty cycle of a cooling system of a computer room air handler associated with the computer room. For instance, computer room IHS 230 may provide one or more instructions to CRAH 320 to increase a duty cycle of a cooling system of CRAH 320 associated with computer room 310. In one or more embodiments, increasing a duty cycle of a cooling system of a computer room air handler associated with the computer room may be performed in response to determining that the supply air temperature of the computer room is to be decreased. In one or more embodiments, CRAH 320 may include the cooling system. In one or more embodiments, increasing a duty cycle of a cooling system of a computer room air handler associated with the computer room may increase a lifespan of an information handling system and/or may increase one or more lifespans of one or more components of an information handling system. For example, increasing a lifespan of an information handling system and/or increasing one or more lifespans of one or more components of an information handling system may reduce one or more environmental pollutants by reducing cyber waste and/or by conserving energy utilized in producing a replacement information handling system and/or in producing replacement components of an information handling system.

In one or more embodiments, one or more of the method and/or process elements and/or one or more portions of a method and/or processor elements may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, one or more systems, one or more methods, and/or one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
at least one processor; and
a memory medium, coupled to the at least one processor, that stores instructions executable by the at least one processor, which when executed by the at least one processor, cause the information handling system to:
   access a database that stores a plurality of ambient temperature limits associated with a respective plurality of information handling systems located in a computer room;
   receive the plurality of ambient temperature limits from the database;
   receive a plurality of ambient temperatures associated with the plurality of information handling systems;
   determine a plurality of ambient temperature margins based at least on the plurality of ambient temperature limits and the plurality of ambient temperatures;
   determine that each ambient temperature margin of the plurality of ambient temperature margins is above an ambient temperature margin threshold of a plurality of ambient temperature margin thresholds associated with the plurality of information handling systems;
   in response to determining that each ambient temperature margin of the plurality of ambient temperature margins is above the ambient temperature margin threshold of the plurality of ambient temperature margin thresholds associated with the plurality of information handling systems, determine that a supply air temperature of the computer room is to be increased;
   in response to determining that the supply air temperature of the computer room is to be increased, reduce a duty cycle of a cooling system of a computer room air handler associated with the computer room;
   determine that a first ambient temperature margin of the plurality of ambient temperature margins meets or is below a first ambient temperature margin threshold of the plurality of ambient temperature margin thresholds associated with a first information handling system of the plurality of information handling systems;
   determine that a second ambient temperature margin of the plurality of ambient temperature margins is above a second ambient temperature margin threshold of the plurality of ambient temperature margin thresholds associated with a second information handling system of the plurality of information handling systems;
   in response to determining that the first ambient temperature margin meets or is below the first ambient temperature margin threshold and determining that the second ambient temperature margin is above the second ambient temperature margin threshold, determine if the second information handling system includes applicable hardware utilized by a workload being processed by the first information handling system;
   if the second information handling system includes the applicable hardware utilized by the workload, transfer the workload to the second information handling system; and
   if the second information handling system does not include the applicable hardware utilized by the workload:
      determine that a third ambient temperature margin of the plurality of ambient temperature margins is above a third ambient temperature margin threshold of the plurality of ambient temperature margin thresholds associated with a third information handling system of the plurality of information handling systems;
      determine that the third information handling system includes the applicable hardware utilized by the workload; and
      transfer the workload to the third information handling system.

2. The information handling system of claim 1, wherein the instructions further cause the information handling system to:
   receive a plurality of supply air temperatures from the plurality of information handling systems, wherein the plurality of supply air temperatures are based at least on inlet temperatures of the plurality of information handling systems.

3. The information handling system of claim 2, wherein the instructions further cause the information handling system to:
   determine a maximum supply air temperature from the plurality of supply air temperatures; and
   determine that the maximum supply air temperature is below a threshold temperature;
   wherein determining that the supply air temperature of the computer room is to be increased is based at least on determining that the maximum supply air temperature is below the threshold temperature.

4. The information handling system of claim 1, wherein the instructions further cause the information handling system to:
   determine a minimum ambient temperature margin from the plurality of ambient temperature margins;

wherein, to determine that the supply air temperature of the computer room is to be increased, the instructions further cause the information handling system to determine that the supply air temperature of the computer room is to be increased by the minimum ambient temperature margin.

5. The information handling system of claim 1, wherein the workload includes a virtual machine.

6. A method, comprising:
accessing a database that stores a plurality of ambient temperature limits associated with a respective plurality of information handling systems located in a computer room;
receiving the plurality of ambient temperature limits from the database;
receiving a plurality of ambient temperatures associated with the plurality of information handling systems;
determining a plurality of ambient temperature margins based at least on the plurality of ambient temperature limits and the plurality of ambient temperatures; and
determining that each ambient temperature margin of the plurality of ambient temperature margins above an ambient temperature margin threshold of a plurality of ambient temperature margin thresholds associated with the plurality of information handling systems;
in response to the determining that each ambient temperature margin of the plurality of ambient temperature margins is above the ambient temperature margin threshold of the plurality of ambient temperature margin thresholds associated with the plurality of information handling systems, determining that a supply air temperature of the computer room is to be increased;
in response to the determining that the supply air temperature of the computer room is to be increased, reducing a duty cycle of a cooling system of a computer room air handler associated with the computer room;
determining that a first ambient temperature margin of the plurality of ambient temperature margins meets or is below a first ambient temperature margin threshold of the plurality of ambient temperature margin thresholds associated with a first information handling system of the plurality of information handling systems;
determining that a second ambient temperature margin of the plurality of ambient temperature margins is above a second ambient temperature margin threshold of the plurality of ambient temperature margin thresholds associated with a second information handling system of the plurality of information handling systems;
in response to the determining that the first ambient temperature margin meets or is below the first ambient temperature margin threshold and the determining that the second ambient temperature margin is above the second ambient temperature margin threshold, determining if the second information handling system includes applicable hardware utilized by a workload being processed by the first information handling system;
if the second information handling system includes the applicable hardware utilized by the workload, transferring the workload to the second information handling system; and
if the second information handling system does not include the applicable hardware utilized by the workload:
determining that a third ambient temperature margin of the plurality of ambient temperature margins is above a third ambient temperature margin threshold of the plurality of ambient temperature margin thresholds associated with a third information handling system of the plurality of information handling systems;
determining that the third information handling system includes the applicable hardware utilized by the workload; and
transferring the workload to the third information handling system.

7. The method of claim 6, further comprising:
receiving a plurality of supply air temperatures from the plurality of information handling systems, wherein the plurality of supply air temperatures are based at least on inlet temperatures of the plurality of information handling systems.

8. The method of claim 7, further comprising:
determining a maximum supply air temperature from the plurality of supply air temperatures; and
determining that the maximum supply air temperature is below a threshold temperature;
wherein the determining that the supply air temperature of the computer room is to be increased is based at least on the determining that the maximum supply air temperature is below the threshold temperature.

9. The method of claim 6, further comprising:
determining a minimum ambient temperature margin from the plurality of ambient temperature margins;
wherein the determining that the supply air temperature of the computer room is to be increased includes determining that the supply air temperature of the computer room is to be increased by the minimum ambient temperature margin.

10. The method of claim 6, wherein the workload includes a virtual machine.

11. A computer-readable non-transitory memory medium that includes instructions that, when executed by at least one processor of an information handling system, cause the information handling system to:
access a database that stores a plurality of ambient temperature limits associated with a respective plurality of information handling systems located in a computer room;
receive the plurality of ambient temperature limits from the database;
receive a plurality of ambient temperatures associated with the plurality of information handling systems;
determine a plurality of ambient temperature margins based at least on the plurality of ambient temperature limits and the plurality of ambient temperatures;
determine that each ambient temperature margin of the plurality of ambient temperature margins is above an ambient temperature margin threshold of a plurality of ambient temperature margin thresholds associated with the plurality of information handling systems;
in response to determining that each ambient temperature margin of the plurality of ambient temperature margins is above the ambient temperature margin threshold of the plurality of ambient temperature margin thresholds associated with the plurality of information handling systems, determine that a supply air temperature of the computer room is to be increased;
in response to determining that the supply air temperature of the computer room is to be increased, reduce a duty cycle of a cooling system of a computer room air handler associated with the computer room;
determine that a first ambient temperature margin of the plurality of ambient temperature margins meets or is below a first ambient temperature margin threshold of the plurality of ambient temperature margin thresholds associated with a first information handling system of the plurality of information handling systems;

determine that a second ambient temperature margin of the plurality of ambient temperature margins is above a second ambient temperature margin threshold of the plurality of ambient temperature margin thresholds associated with a second information handling system of the plurality of information handling systems;

in response to determining that the first ambient temperature margin meets or is below the first ambient temperature margin threshold and determining that the second ambient temperature margin is above the second ambient temperature margin threshold, determine if the second information handling system includes applicable hardware utilized by a workload being processed by the first information handling system;

if the second information handling system includes the applicable hardware utilized by the workload, transfer the workload to the second information handling system; and if the second information handling system does not include the applicable hardware utilized by the workload:
   determine that a third ambient temperature margin of the plurality of ambient temperature margins is above a third ambient temperature margin threshold of the plurality of ambient temperature margin thresholds associated with a third information handling system of the plurality of information handling systems;
   determine that the third information handling system includes the applicable hardware utilized by the workload; and
   transfer the workload to the third information handling system.

12. The computer-readable non-transitory memory medium of claim 11, wherein the instructions further cause the information handling system to:
   receive a plurality of supply air temperatures from the plurality of information handling systems, wherein the plurality of supply air temperatures are based at least on inlet temperatures of the plurality of information handling systems.

13. The computer-readable non-transitory memory medium of claim 12, wherein the instructions further cause the information handling system to:
   determine a maximum supply air temperature from the plurality of supply air temperatures; and
   determine that the maximum supply air temperature is below a threshold temperature;
   wherein determining that the supply air temperature of the computer room is to be increased is based at least on determining that the maximum supply air temperature is below the threshold temperature.

14. The computer-readable non-transitory memory medium of claim 11, wherein the instructions further cause the information handling system to:
   determine a minimum ambient temperature margin from the plurality of ambient temperature margins;
   wherein, to determine that the supply air temperature of the computer room is to be increased, the instructions further cause the information handling system to determine that the supply air temperature of the computer room is to be increased by the minimum ambient temperature margin.

15. The computer-readable non-transitory memory medium of claim 11, wherein the workload includes a virtual machine.

* * * * *